(12) United States Patent
Hu et al.

(10) Patent No.: US 9,750,170 B2
(45) Date of Patent: Aug. 29, 2017

(54) AUTOMATIC ASSEMBLING SYSTEM

(71) Applicant: Tyco Electronics (Shanghai) Co. Ltd., Shanghai (CN)

(72) Inventors: Lvhai Hu, Shanghai (CN); Dandan Zhang, Shanghai (CN); Fengchun Xie, Shanghai (CN); Robert Neil Shaddock, Doylestown, PA (US)

(73) Assignees: TE Connectivity Corporation, Berwyn, PA (US); Tyco Electronics (Shanghai) Co. Ltd., Shanghai (CN)

( * ) Notice: Subject to any disclaimer, the term of this patent is extended or adjusted under 35 U.S.C. 154(b) by 371 days.

(21) Appl. No.: 14/335,299

(22) Filed: Jul. 18, 2014

(65) Prior Publication Data

US 2015/0020374 A1 Jan. 22, 2015

(30) Foreign Application Priority Data

Jul. 19, 2013 (CN) .......................... 2013 1 0305813

(51) Int. Cl.
*H05K 13/04* (2006.01)
*B23P 19/10* (2006.01)
(Continued)

(52) U.S. Cl.
CPC .......... *H05K 13/0404* (2013.01); *B23P 19/10* (2013.01); *B25J 9/1633* (2013.01); *B25J 9/1687* (2013.01); *B25J 13/085* (2013.01); *B25J 15/0616* (2013.01); *B25J 17/0208* (2013.01); *H01L 21/52* (2013.01); *H01L 24/75* (2013.01); *G05B 2219/40032* (2013.01); *G05B 2219/40223* (2013.01); *H01L 2224/753* (2013.01); *H01L 2224/7592* (2013.01); *H01L 2224/7598* (2013.01); *H01L 2224/75705* (2013.01); *H01L 2224/75745* (2013.01); (Continued)

(58) Field of Classification Search
CPC B23P 19/00; B23P 19/02; B23P 19/04; B23P 19/10; H05K 13/00; H05K 13/0015; H05K 13/0404; B25J 9/1533; B25J 9/1687; B25J 15/0616; B25J 17/0208; B26J 13/085; G05B 2219/40032; G05B 2219/40223; H05L 21/52; H01L 24/75; H01L 2224/753; H01L 2224/75705; H01L 2224/75746; H01L 2224/75804; H01L 2224/75901; H01L 2224/7592; H01L 2224/7598; Y10T 29/49002; Y10T 29/49945; Y10T 29/5177; Y10T 29/53039
See application file for complete search history.

(56) References Cited

FOREIGN PATENT DOCUMENTS

JP 3288518 B2 * 6/2002

* cited by examiner

*Primary Examiner* — Carl Arbes
(74) *Attorney, Agent, or Firm* — Barley Snyder

(57) ABSTRACT

An automatic assembling system, comprising: a robot performing an operation of inserting a first member into a second member; a force sensor for detecting an insertion force exerted on the first member by the robot; and a controller for controlling the insertion force with a closed-loop feedback control according to a difference between the insertion force detected by the force sensor and a predetermined insertion force, so that the insertion force is less than the predetermined insertion force to protect the first member and/or the second member from damage due to an overlarge insertion force. The present invention also is directed to a method for automatically assembling a product.

12 Claims, 3 Drawing Sheets

(51) Int. Cl.
*H01L 23/00* (2006.01)
*B25J 9/16* (2006.01)
*B25J 13/08* (2006.01)
*B25J 15/06* (2006.01)
*B25J 17/02* (2006.01)
*H01L 21/52* (2006.01)

(52) U.S. Cl.
CPC ............... *H01L 2224/75804* (2013.01); *H01L 2224/75901* (2013.01); *Y10T 29/49002* (2015.01); *Y10T 29/49945* (2015.01); *Y10T 29/5177* (2015.01); *Y10T 29/53039* (2015.01)

AUTOMATIC ASSEMBLING SYSTEM

CROSS-REFERENCE TO RELATED APPLICATION

This application claims the benefit of the filing date under 35 U.S.C. §119(a)-(d) of Chinese Patent Application No. 2013103058137 filed on Jul. 19, 2013 in the State Intellectual Property Office of China, the whole disclosure of which is incorporated herein by reference.

FIELD OF THE INVENTION

The present invention relates to a system and a method for automatically assembling a product, more particularly, relates to a system and a method for automatically assembling a product by a vision robot.

BACKGROUND

Generally, an electronic product is composed of many elements or members. Accordingly, it is necessary to assemble many members to obtain the electronic product.

Since these members for forming the electronic product are very tiny in size, it is difficult to automatically assemble these members by a machine. In the prior art, typically, these tiny members are assembled together manually. For example, when it is necessary to insert a tiny member into another tiny member, in the prior art, an operator manually performs the insertion operation. However, manual insertion has a low efficiency and a poor accuracy, for example, the insertion tolerance is often beyond a range of ±0.05 mm. Furthermore, since these members of the electronic product are also very fragile, it is difficult to control the insertion force while manually inserting a tiny member into another tiny member, and these fragile members can be damaged due to overlarge insertion forces.

SUMMARY

The present invention has been made to overcome or alleviate at least one aspect of the above-mentioned disadvantages.

According to an object of the present invention, there is provided an automatic assembling system and method that can assemble an electronic product with high efficiency and accuracy.

According to another object of the present invention, there is provided an automatic assembling system and method that can accurately control the force of inserting a member into another member so that the insertion force is less than an allowable insertion force to protect the electronic produce from damage due to an overlarge insertion force.

According to an aspect of the present invention, there is provided an automatic assembling system, comprising: a robot configured to perform an operation of inserting a first member into a second member; a force sensor for detecting an insertion force exerted by the robot; and a controller for controlling the insertion force in the manner of a close loop feedback control according to a difference between the insertion force detected by the force sensor and a predetermined insertion force, so that the insertion force is less than the predetermined insertion force to prevent the first member and/or the second member from damage due to an overlarge insertion force.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENT(S)

Figure 1:
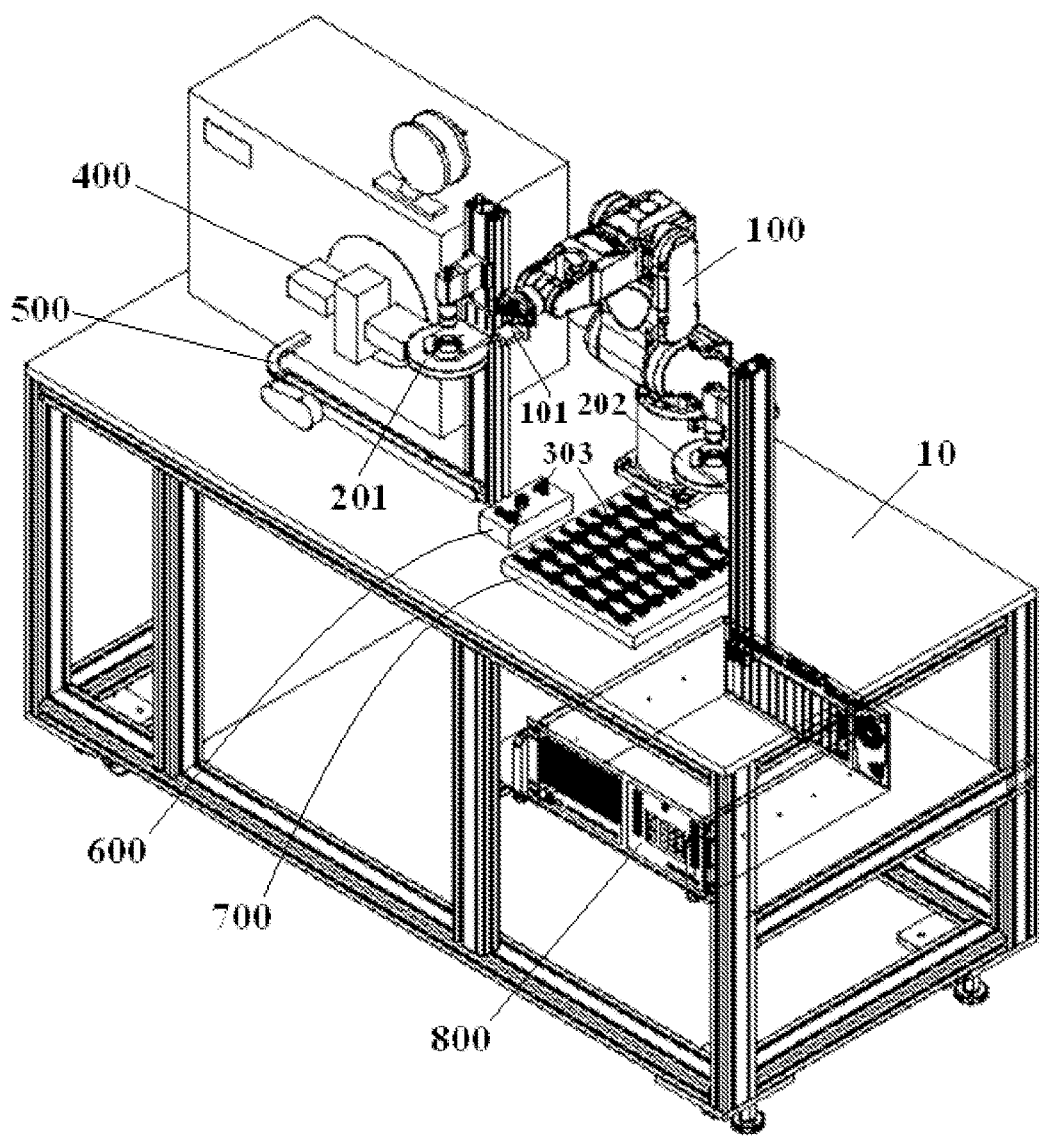
FIG. 1 is a perspective view of a system for automatically assembling an electronic product according to an exemplary embodiment of the present invention.

Exemplary embodiments of the present invention will be described hereinafter in detail with reference to the attached drawings, wherein the like reference numerals refer to the like elements. The present invention may, however, be embodied in many different forms and should not be construed as being limited to the embodiments set forth herein; rather, these embodiments are provided so that the present disclosure will be thorough and complete, and will fully convey the concept of the present invention to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
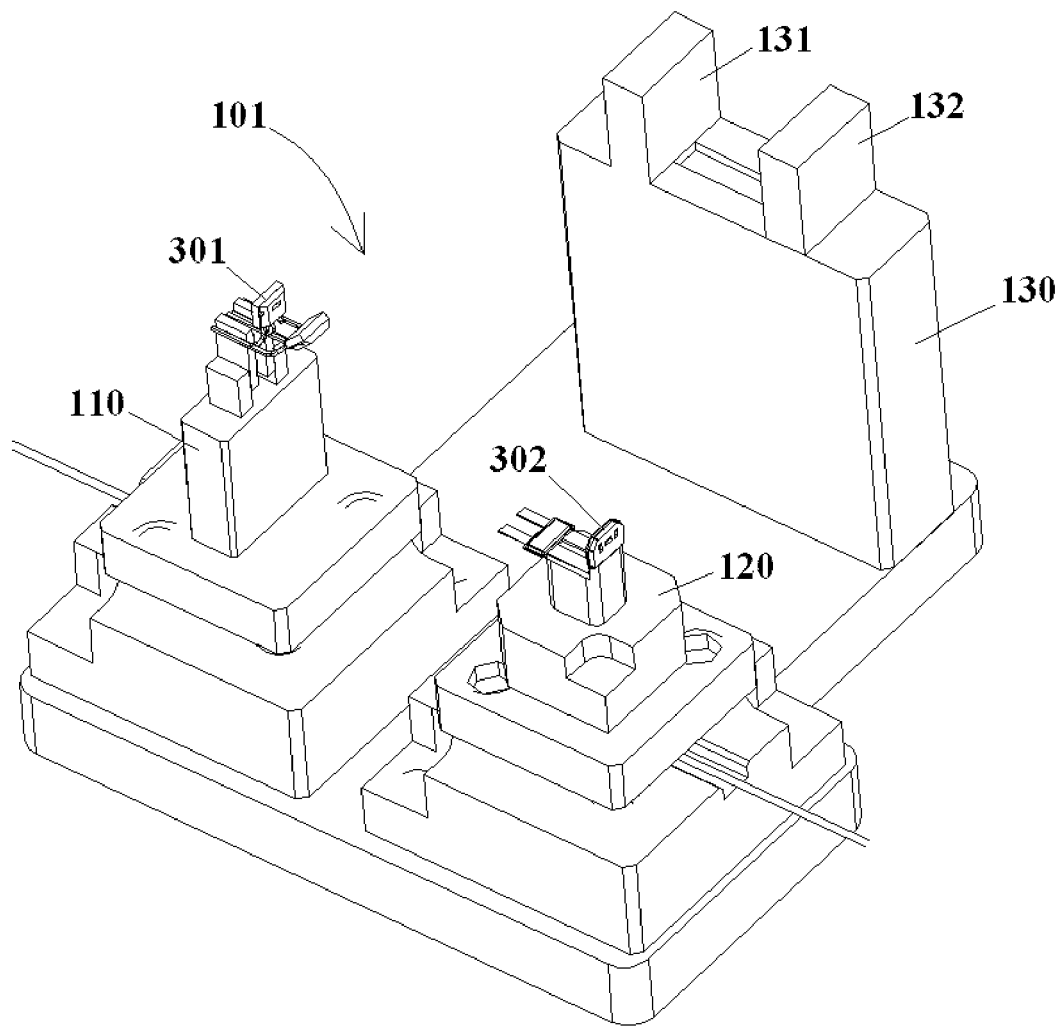
FIG. 2 is a perspective view, on an enlarged scale, of an end effector of a robot shown in FIG. 1.
Figure 3:
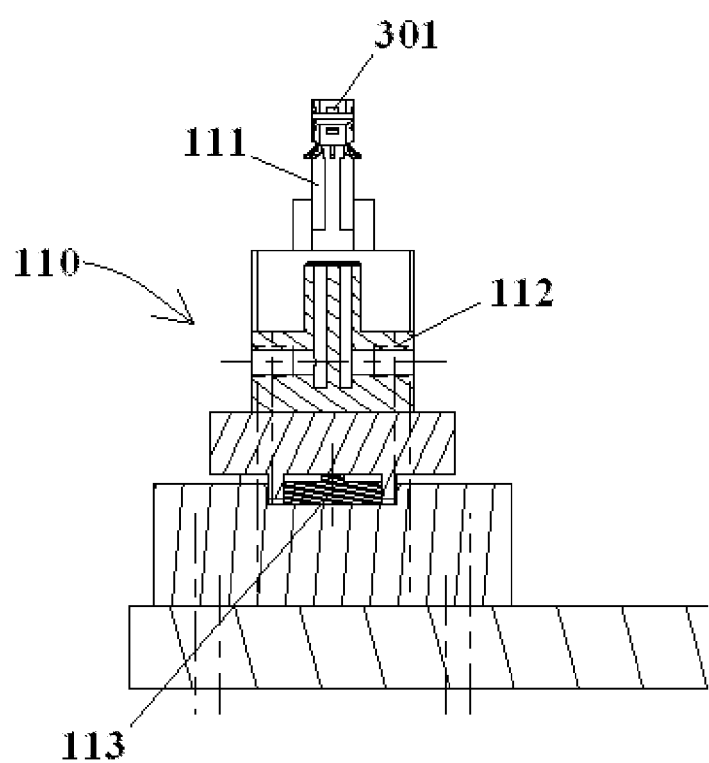
FIG. 3 is a cross-section view of a picker mounted on the end effector of the robot shown in FIG. 2.

Referring to FIGS. 1, 2, and 3, the system for automatically assembling an electronic product mainly comprises a robot 100 (see FIG. 1), a force sensor 113 (see FIG. 3) and a controller 800 (see FIG. 1).

In an exemplary embodiment of the present invention, the robot 100 is performs an operation of inserting a first member 301 into a second member 303. The force sensor 113 detects an insertion force emanating from the robot and exerted on the first member 301 by the robot 100. The controller 800 controls the insertion force emanating from robot 100 in the manner of a closed-loop feedback control according to a difference between the insertion force emanating from the robot and detected by the force sensor 113 and a predetermined insertion force, so that the insertion force emanating from the robot is less than the predetermined insertion force to protect the first member and/or the second member from damage due to an overlarge insertion force.

In an exemplary embodiment of the present invention, the predetermined insertion force may be set to be equal to or less than an allowable insertion force below which the first member and the second member cannot be damaged.

In an exemplary embodiment of the present invention, the first member comprises a chip 301, and the second member comprises a housing 303. The chip 301 is inserted into the housing 303 by the robot 100 to form an assembled electronic product.

But the present invention is not limited to the illustrated embodiments. The system of the present invention may be used to assemble other products having many tiny members as long as the control program is arranged appropriately according to the type of the product to be assembled. For example, the system of the present invention may be used to insert an optical fiber (the first member) into a through hole of a fiber ferrule (the second member) to form a fiber ferrule assembly.

As shown in FIG. 1, in another exemplary embodiment of the present invention, the automatic assembling system may further comprise a cutting and bending mechanism 400 for cutting and bending legs of the chip 301 before inserting the chip 301 into the housing 303.

As shown in FIG. 1, in another exemplary embodiment of the present invention, the automatic assembling system may further comprise a conveyer belt 500 for feeding the chip 301 whose legs have been cut and bent by the cutting and bending mechanism 400 to a predetermined position, for example, below a first camera 201.

As shown in FIG. 1, in another exemplary embodiment of the present invention, the automatic assembling system may further comprise a first camera 201 for visually guiding the robot 100 to pick up the chip 301 that has been fed to the predetermined position by the conveyer belt 500 and insert the chip 301 into the respective housing 303.

As shown in FIG. 1, in another exemplary embodiment of the present invention, the automatic assembling system may further comprise a second camera 202 for visually guiding the robot 100 to pick up the housing 303 from a tray in which the housing 303 is stored and place the housing 303 into a positioning slot (not shown) formed in a positioning plate 600.

As shown in FIG. 1, in another exemplary embodiment of the present invention, the robot 100 inserts the chip 301 into the housing 303 positioned in the positioning slot of the positioning plate 600 under the guidance of the first camera 201; and the robot 100 replaces the housing 303, into which the chip 301 has been inserted, to the tray 700 under the guidance of the second camera 202.

In an exemplary embodiment of the present invention, an array of grooves are formed in the tray 700, with the grooves shaped and adapted to receive the corresponding housings 303 therein.

In an exemplary embodiment of the present invention, as shown in FIG. 1, the robot 100 is a 6-axis multi-freedom robot.

As shown in FIG. 2, in an exemplary embodiment of the present invention, the end effector 101 of the robot 100 comprises a first picker 110, 120 for picking up the chip 301, 302 and a second picker 130 for picking up the housing 303.

In an exemplary embodiment of the present invention, the end effector 101 of the robot 100 may comprise one or more kinds of first pickers 110, 120 for picking up one or more kinds of chips 301, 302. As shown in FIG. 2, the end effector 101 comprises two kinds of first pickers 110, 120 for picking up two kinds of chips 301, 302.

Again, the present invention is not limited to the illustrated embodiments. The end effector 101 of the robot 100 may comprise one, three or more kinds of first pickers for picking up one, three or more kinds of chips. Similarly, the end effector 101 of the robot 100 may comprise one or more kinds of second pickers for picking up one or more kinds of housings.

As shown in FIG. 3, in an exemplary embodiment of the present invention, the force sensor 113 is provided in the first picker 110. The force sensor 113 may be a piezoelectric force transducer or other suitable force sensor.

In an exemplary embodiment of the present invention, as shown in FIG. 3, the first picker 110 mainly comprises a vacuum suction nozzle 111 for sucking up the chip 301, and a floating mechanism (adjust mechanism) 112 for eliminating an effect of self weight of the vacuum suction nozzle 111 on the force sensor 113.

The floating mechanism (adjustment mechanism) 112 adjusts an initial value of the force sensor 113 before inserting the chip so that the initial value of the force sensor becomes zero. However, if the self weight of the vacuum suction nozzle 111 is known, the floating mechanism (adjustment mechanism) 112 is not necessary and can be omitted. For example, when the first picker 110 is not provided with the floating mechanism (adjustment mechanism) 112, the real insertion force can be calculated by adding the self weight of the vacuum suction nozzle 111 to the insertion force detected by the sensor 113. It will be noted that the action direction of the self weight of the vacuum suction nozzle 111 on the sensor 113 is the same as the direction of the insertion force. Therefore, the real insertion force is equal to the sum of the insertion force detected by the sensor 113 and the self weight of the vacuum suction nozzle 111. In this way, the effect of self weight of the vacuum suction nozzle 111 on the force sensor 113 can be eliminated.

As shown in FIG. 2, in an exemplary embodiment of the present invention, the second picker 130 comprises a stationary finger 131 and a movable finger 132 movable relative to the stationary finger 131 to pick up the housing 303.

In the illustrated embodiments, since the housing 303 is larger in size than the chip 301, 302, the second picker 130 as a mechanical finger type gripper. But the present invention is not limited to the illustrated embodiments. The second picker 130 may be configured to be a vacuum suction type picker.

As shown in FIG. 1, in an exemplary embodiment of the present invention, the automatic assembling system further comprises a support frame 10. The robot 100, the cutting and bending mechanism 400, the conveyer belt 500, the positioning plate 600, the tray 700 and the controller 800 are mounted on the support frame 10.

With reference to FIGS. 1, 2, and 3, the following describes, in detail, the process of assembling the electronic product by means of the assembling system of the present invention.

First, cutting and bending the legs of the chip 301 by the cutting and bending mechanism 400;

Second, feeding the chip 301, the legs of which have been cut and bent by the cutting and bending mechanism 400, to the predetermined position by the conveyer belt 500;

Third, visually guiding the robot 100 to pick up the housing 303 from the tray in which the housing 303 is stored and placing the housing 303 into the positioning slot formed in the positioning plate 600 by the second camera 202;

Fourth, (a) visually guiding the robot 100 to pick up the chip 301, 302 that has been fed to the predetermined position by the conveyer belt 500; (b) inserting the chip 301, 302 into the housing 303 positioned in the positioning slot of the positioning plate 600; and (c) during inserting the chip 301, 302, controlling the insertion force of the robot 100 in the manner of the closed-loop feedback control according to the difference between the insertion force detected by the force sensor 113 and the predetermined insertion force, so that the insertion force is less than the predetermined insertion force to protect the chip 301, 302 and/or the housing 303 from damage due to overlarge insertion force; and Finally, replacing the housing 303 into which the chip 301, 302 has been inserted to the tray 700 by the robot 100 under the guidance of the second camera 202.

In the system and method according to the above various exemplary embodiments of the present invention, the chip can be inserted into the housing with higher accuracy and efficiency than with the convention manual insertion approach. For example, the present invention can achieve an insertion tolerance within a range of ±0.02 mm or less. Furthermore, in the present invention, the insertion force can be accurately controlled so that the insertion force is less than the allowable insertion force to protect the chip and/or the housing from damage due to an overlarge insertion force beyond the allowable insertion force.

It should be appreciated for those skilled in this art that the above embodiments are intended to be illustrative, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and preceded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An automatic assembling system, comprising:
    a robot for inserting a chip into a housing;
    a cutting and bending mechanism for cutting and bending legs of the chip before inserting the chip into the housing;
    a force sensor positioned to detect an insertion force emanating from the robot and exerted by the robot while inserting the chip into the housing; and
    a controller preset with a predetermined insertion force and responsive to the force sensor for (a) measuring the difference between the predetermined insertion force and the insertion force emanating from the robot and detected by the force sensor while the chip is being inserted in the housing, and (b) controlling the insertion force emanating from the robot in the insertion of the chip into the housing to be less than the preset predetermined insertion force to protect the chip and/or the housing from damage due to an overlarge insertion force.

2. The automatic assembling system according to claim 1, wherein the chip is inserted into the housing by the robot to form an assembled electronic device.

3. The automatic assembling system according to claim 2, further comprising:
    a conveyer belt for feeding the chip, the legs of which have been cut and bent by the cutting and bending mechanism to a predetermined position.

4. The automatic assembling system according to claim 3, further comprising:
    a first camera for visually guiding the robot to (a) pick up the chip, that has been fed to the predetermined position by the conveyer belt, and (b) inserting the chip into the housing.

5. The automatic assembling system according to claim 4, further comprising:
    a second camera for visually guiding the robot to (a) pick up the housing from a tray in which the housing is stored, and (b) place the housing into a positioning slot formed in a positioning plate.

6. The automatic assembling system according to claim 5, wherein the robot inserts the chip into the housing positioned in the positioning slot of the positioning plate under the guidance of the first camera; and
    wherein the robot replaces the housing, into which the chip has been inserted, to the tray under the guidance of the second camera.

7. The automatic assembling system according to claim 6, wherein the robot is a 6-axis multi-freedom robot.

8. The automatic assembling system according to claim 6, wherein the robot comprises an end effector having a first picker for picking up the chip and a second picker for picking up the housing.

9. The automatic assembling system according to claim 8, wherein the end effector includes one or more kinds of first pickers for picking up one or more kinds of chips.

10. The automatic assembling system according to claim 8, wherein the force sensor is in the first picker, and the first picker comprises:
    a vacuum suction nozzle for sucking up the chip; and
    a floating mechanism eliminating an effect of self weight of the vacuum suction nozzle on the force sensor.

11. The automatic assembling system according to claim 8, wherein the second picker comprises:
    a stationary finger; and
    a movable finger movable relative to the stationary finger to pick up the housing.

12. The automatic assembling system according to claim 6, further comprising:
    a support frame to which are mounted the robot, the cutting and bending mechanism, the conveyer belt, the positioning plate, the tray, and the controller thereon.

* * * * *